(12) United States Patent
Hirai

(10) Patent No.: US 8,624,290 B2
(45) Date of Patent: Jan. 7, 2014

(54) DISPLAY DEVICE AND METHOD FOR MANUFACTURING THE SAME

(75) Inventor: Nobukazu Hirai, Kanagawa (JP)

(73) Assignee: Sony Corporation, Tokyo (JP)

( * ) Notice: Subject to any disclaimer, the term of this patent is extended or adjusted under 35 U.S.C. 154(b) by 402 days.

(21) Appl. No.: 12/626,073

(22) Filed: Nov. 25, 2009

(65) Prior Publication Data
US 2010/0133572 A1 Jun. 3, 2010

(30) Foreign Application Priority Data
Dec. 2, 2008 (JP) ................................ 2008-307338

(51) Int. Cl.
*H01L 33/00* (2010.01)
*H01L 21/00* (2006.01)

(52) U.S. Cl.
USPC ............................... 257/103; 257/98; 438/29

(58) Field of Classification Search
USPC ................................. 438/22–47; 257/79–103
See application file for complete search history.

(56) References Cited

U.S. PATENT DOCUMENTS

| | | | |
|---|---|---|---|
| 5,953,585 A * | 9/1999 | Miyaguchi | 438/35 |
| 6,111,274 A * | 8/2000 | Arai | 257/96 |
| 6,184,960 B1 * | 2/2001 | Sawayama et al. | 349/139 |
| 7,230,271 B2 * | 6/2007 | Yamazaki et al. | 257/72 |
| 7,470,610 B2 * | 12/2008 | Nishigaki | 438/623 |
| 7,947,518 B2 * | 5/2011 | Tsai et al. | 438/34 |
| 2001/0002857 A1 * | 6/2001 | Shimada et al. | 349/138 |
| 2002/0072139 A1 * | 6/2002 | Kashiwabara | 438/29 |
| 2003/0030381 A1 * | 2/2003 | Yamazaki et al. | 315/169.1 |
| 2003/0201716 A1 * | 10/2003 | Yamazaki et al. | 313/506 |
| 2003/0227021 A1 * | 12/2003 | Yamazaki et al. | 257/83 |
| 2005/0181526 A1 * | 8/2005 | Pichler | 438/22 |
| 2006/0022585 A1 * | 2/2006 | Aziz | 313/504 |
| 2006/0113900 A1 * | 6/2006 | Oh | 313/504 |
| 2007/0210323 A1 * | 9/2007 | Halls et al. | 257/86 |

FOREIGN PATENT DOCUMENTS

JP 2002-216976 8/2002

\* cited by examiner

*Primary Examiner* — Fernando L Toledo
*Assistant Examiner* — Karen Kusumakar
(74) *Attorney, Agent, or Firm* — K&L Gates LLP

(57) ABSTRACT

A display device is provided which includes: lower electrodes each have a light-reflective first metal material layer and a second metal material layer provided thereon which has a superior alkaline-solution resistance to that of the first metal material layer; an insulating pattern which is formed from a photosensitive composition material, which has opening portions to expose the lower electrodes, and which covers peripheries of the lower electrodes; organic layers each of which at least include an organic light emitting layer and which are provided in the opening portions so as to cover the lower electrodes; and a light-transmissive upper electrode provided to sandwich the organic layers with the lower electrodes.

15 Claims, 8 Drawing Sheets

DISPLAY DEVICE AND METHOD FOR MANUFACTURING THE SAME

CROSS REFERENCES TO RELATED APPLICATIONS

The present application claims priority to Japanese Priority Patent Application JP 2008-307338 filed in the Japan Patent Office on Dec. 2, 2008, the entire content of which is hereby incorporated by reference.

BACKGROUND

The present disclosure relates to a display device and a method for manufacturing the same, and in more particular relates to a display device including organic electroluminescent elements and a method for manufacturing the display device.

An organic electroluminescent element using electroluminescence (hereinafter referred to as "EL") of an organic material has an organic layer which includes an organic hole transport layer and an organic light emitting layer laminated thereto between a lower electrode and an upper electrode each functioning as an anode or a cathode and has drawn an attention as a light emitting element that can emit high luminance light by a low voltage direct current drive.

An active matrix display device using organic electroluminescent elements as described above has a structure in which organic electroluminescent elements are provided on an interlayer insulating film which covers pixel drive circuits formed by using thin film transistors. Hence, in order to ensure an aperture ratio of a pixel, an organic electroluminescent element is advantageously formed to have a so-called upper-surface light extraction structure (hereinafter referred to as "top emission structure") in which light is extracted from a side opposite to a substrate.

In the top emission structure, when a metal material, such as aluminum or silver, having superior light reflection characteristics is used as a lower electrode, an emission light extraction efficiency of an organic electroluminescent element can be improved. In this case, since aluminum and silver each have a high work function, the lower electrode formed therefrom functions as an anode. Hence, an upper electrode is formed to function as a cathode.

In addition, in the organic electroluminescent element having a top emission structure described above, an electric field is concentrated on a portion at which the distance between the lower electrode and the upper electrode is locally narrowed due to surface roughness of the lower electrode formed of a light-reflective metal material, and as a result, short-circuiting is liable to occur between the lower electrode and the upper electrode. Hence, the structure of the lower electrode has been proposed in which a light-reflective metal material layer and a buffer thin layer composed of an oxide of the light-reflective metal material are laminated to each other. According to the above proposal, by the structure described above, the surface roughness of the metal material layer is reduced by the buffer thin layer composed of the oxide, and the distance between the upper electrode and the lower electrode can be made uniform, so that short-circuiting caused by electric-field concentration can be prevented (see Japanese Unexamined Patent Application Publication No. 2002-216976).

In a display device in which organic electroluminescent elements are arranged on a substrate, an insulating pattern is provided for element isolation of the organic electroluminescent elements. This insulating pattern which has aperture windows to widely expose lower electrodes is provided to cover peripheries thereof and is formed from a photosensitive composition by patterning in a lithographic process. Hence, when the insulating pattern is formed, the lower electrodes are exposed to an alkaline developing solution used in a development treatment of the lithographic process. However, since aluminum and silver forming the light-reflective lower electrodes are a material having inferior resistance to an alkaline solution, the lower electrodes are damaged in this development treatment, and as a result, a lighting failure of a display may arise.

Accordingly, it is desirable to provide a display device which can prevent a lighting failure of a top-emission organic electroluminescent element caused by degradation of a lower electrode in a development treatment and a method for manufacturing the display device.

SUMMARY

A display device according to an embodiment includes lower electrodes each having a light-reflective first metal material layer and a second metal material layer provided thereon which has a superior resistance against an alkaline solution to that of the first metal material layer. In addition, the display device according to the above embodiment also includes an insulating pattern which is formed from a photosensitive composition material, which has opening portions to expose the lower electrodes, and which covers peripheries of the lower electrodes. In addition, the display device according to the above embodiment also includes organic layers each of which at least have an organic light emitting layer and which are provided in the opening portions so as to cover the lower electrodes. Furthermore, the display device according to the above embodiment includes a light-transmissive upper electrode so as to sandwich the organic layers with the lower electrodes.

In addition, a method for manufacturing a display device according to an embodiment is a method for manufacturing the display device described above and includes the following steps. First, lower electrodes are formed by patterning in each of which a second metal material layer having a superior alkaline-solution resistance to that of a light-reflective first metal material layer is provided thereon. Subsequently, an insulating pattern which has opening portions to expose the lower electrodes and which covers peripheries thereof is formed by a lithographic method. Next, organic layers each of which at least include an organic light emitting layer are formed in the opening portions of the insulating pattern so as to cover the lower electrodes. Subsequently, a light-transmissive upper electrode is formed so as to sandwich the organic layers with the lower electrodes.

A display device having the structure as described above includes organic electroluminescent elements in each of which an organic layer including an organic light emitting layer is provided between a lower electrode and an upper electrode and is a so-called top emission type display device in which emission light is extracted from a side of the light-transmissive upper electrode. In particular, the structure is formed so that a surface layer of the lower electrode is formed of a second metal material layer having a superior alkaline-solution resistance to that of a light-reflective first metal material layer. Hence, for example, when an insulating pattern is formed, the resistance against an alkaline solution used in a lithographic treatment can be ensured by the presence of this second metal material layer, and as a result, the quality of the first metal material layer is maintained.

As described above, according to the embodiments, since the quality of the light-reflective first metal material layer can be maintained even when an alkaline solution is used in a lithographic treatment, in a display device including top emission organic electroluminescent elements, lighting failures thereof caused by degradation in the lower electrodes in an alkaline development treatment can be prevented.

Additional features and advantages are described herein, and will be apparent from the following Detailed Description and the figures.

DETAILED DESCRIPTION

Hereinafter, with reference to the drawings, embodiments will be described in detail in accordance with the order of the structure of a display device and a manufacturing method thereof.

Structure of Display Device of First Embodiment

Figure 1:
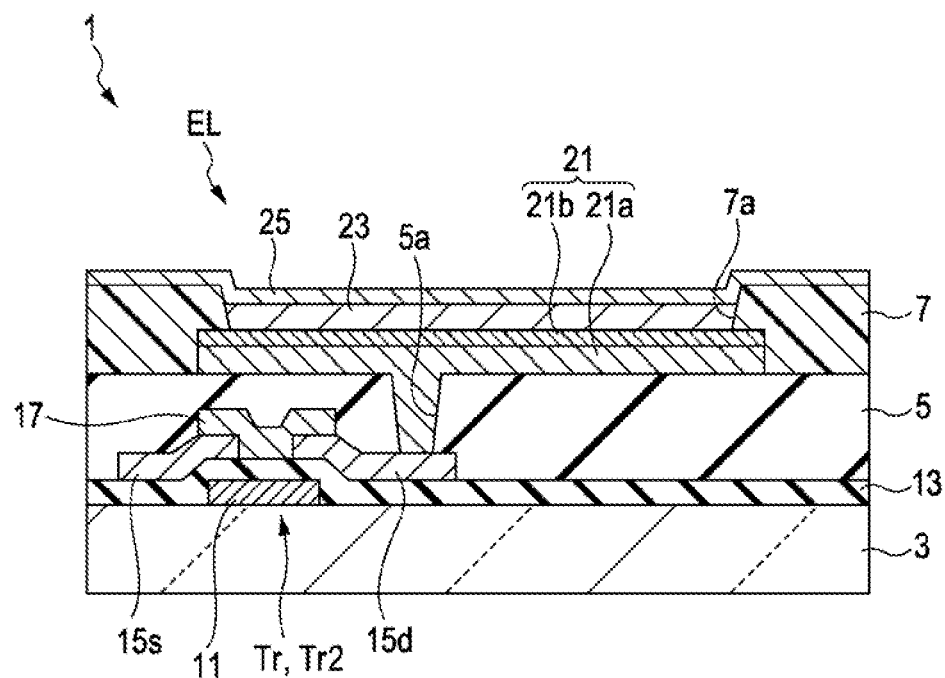
FIG. 1 is a cross-sectional view showing the structure of a display device according to a first embodiment.

FIG. 1 is a cross-sectional view of the structure of one pixel of a display device according to a first embodiment. A display device 1 shown in this figure is an active matrix display device including organic electroluminescent elements EL, and the structure thereof is as follows.

That is, a thin film transistor Tr is provided in each pixel on a substrate 3 and is covered with an interlayer insulating film 5. A connection hole 5a extending to the thin film transistor Tr is provided in the interlayer insulating film 5. In addition, in each pixel on the interlayer insulating film 5, an organic electroluminescent element EL connected to the thin film transistor Tr through the connection hole 5a is provided. This organic electroluminescent element EL is element-isolated by an insulating pattern 7 provided on the interlayer insulating film 5.

Among the above constituent elements, the substrate 3 may be composed, for example, of a glass substrate or a plastic substrate or may also be composed of another material substrate in which the surface thereof is insulated.

The thin film transistor Tr is formed as a bottom gate/bottom contact organic thin film transistor using an organic semiconductor material. In the thin film transistor Tr described above, a gate electrode 11 is provided on the substrate 3, and a gate insulating film 13 is provided to cover the gate electrode 11. On the gate insulating film 13, a source electrode 15s and a drain electrode 15d are provided so that end portions thereof face each other over the gate electrode 11. In addition, a semiconductor layer 17 composed of an organic semiconductor material is formed by patterning over the gate electrode 11 to extend from the end portion of the source electrode 15s to the end portion of the drain electrode 15, and as a result, the thin film transistor Tr is formed in which this semiconductor layer 17 is used as a channel forming portion.

In addition, the interlayer insulating film 5 is preferably formed as a planarized insulating film having a flat surface. The connection hole 5a formed in this interlayer insulating film 5 is provided so as to extend to the drain electrode 15d of the thin film transistor Tr.

In addition, in the organic electroluminescent element EL, a lower electrode 21 is provided which is connected to the drain electrode 15d of the thin film transistor Tr through the connection hole 5a provided in the interlayer insulating film 5. In this first embodiment, this lower electrode 21 characteristically has a laminate structure formed of metal material layers. That is, the lower electrode 21 includes a light-reflective first metal material layer 21a and a second metal material layer 21b provided thereon which has a superior resistance (alkaline-solution resistance) against an alkaline solution to that of the first metal material layer 21a.

For the first metal material layer 21a, a material having higher light reflection characteristics is more preferably used, and the first metal material layer 21a described above is formed, for example, of aluminum, silver, or an alloy thereof.

In addition, for the second metal material layer 21b, a material having a more superior alkaline-solution resistance is more preferably used, and in addition, a material which can be etched by a common process applicable to the first metal material layer 21a is also preferable, so that an increase in the number of steps of forming the lower electrode 21 can be prevented. Accordingly, when the first metal material layer 21a is formed of aluminum, titanium is used for the second metal material layer 21b.

In addition, the second metal material layer 21b may be provided on the first metal material layer 21a described above so that the surface of the lower electrode 21 is formed of the second metal material layer 21b, and an additional conductive layer may be further provided as an underlayer of the first metal material layer 21a. In the case described above, as the additional conductive layer, for example, an adhesion layer is provided. When the additional layer (adhesion layer) is formed of a material which can be etched by a common step applicable to the first metal material layer 21a and the second metal material layer 21b, it is more preferable. Hence, for example, as the adhesion layer, a layer formed of titanium is preferably provided.

The lower electrode 21 in which the second metal material layer 21b composed of titanium is provided on the first metal material layer 21a composed of aluminum has a function as an anode.

In addition, it is important that the second metal material layer 21b be formed so that the transmission of light generated in the organic electroluminescent element EL can be ensured. In particular, the second metal material layer 21b is preferably formed to have a small thickness so that the light reflection at the first metal material layer 21a can be maintained at approximately 50%.

Figure 2:
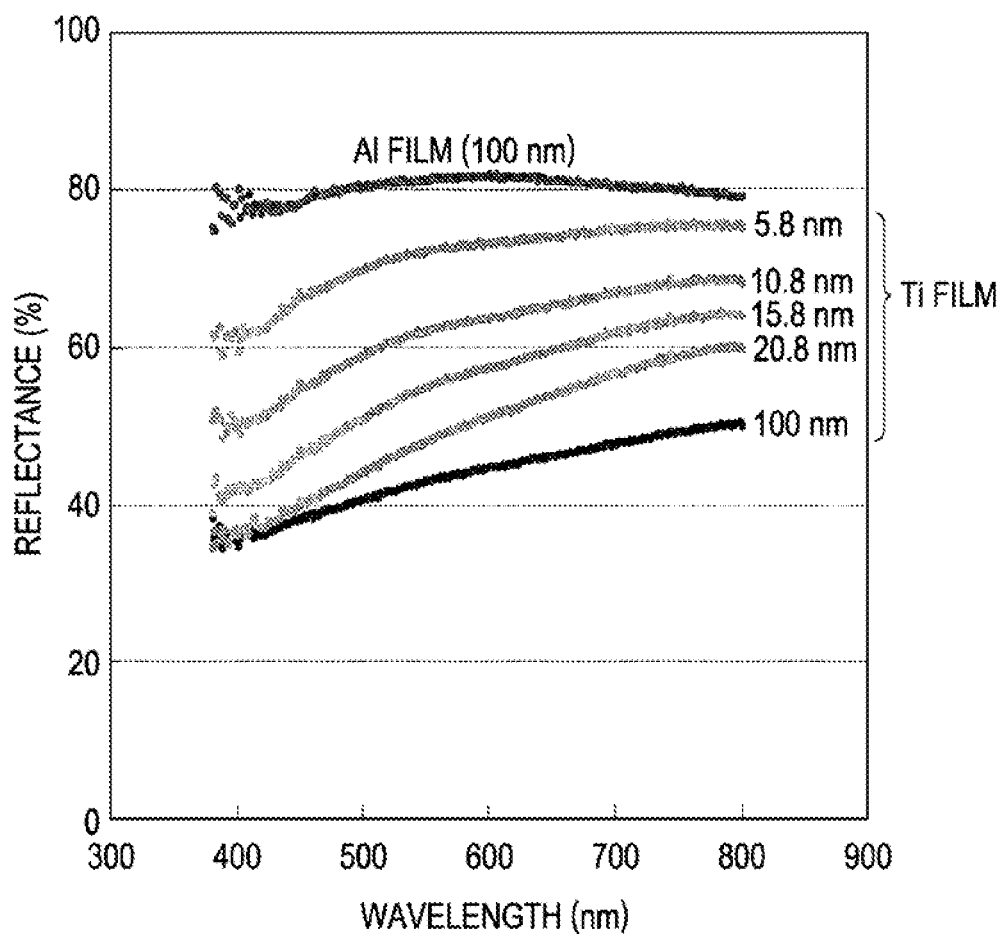
FIG. 2 is a graph showing the change in reflectance at an aluminum surface with the wavelength and the change in reflectance with the wavelength of structures in which titanium films having different thicknesses are provided on the aluminum surface.

FIG. 2 is a graph showing the change in reflectance at the surface of an aluminum film (thickness: 100 nm) with the wavelength and the change in reflectances with the wavelength of laminates in which titanium films having different thicknesses are provided on the aluminum film. As shown in the graph, it is understood that when the aluminum film having a thickness of 100 nm is used as the first metal material layer 21a, and a titanium film forming the second metal material layer 21b has a thickness of 15 nm or less, the refection of visible light at the first metal material layer 21a can be maintained at least 50%. That is, since the refection at the first metal material layer 21a through a titanium film having a thickness of 15 nm or less which is used as the second metal material layer 21b can be maintained at least 50%, it is understood that when the reflectance of the aluminum film forming the first metal material layer 21a is approximately 80%, by the laminate in which a titanium layer is provided on the aluminum film, a reflectance of 40% or more can be obtained. Hence, as one example, in this embodiment, the lower electrode 21 is formed to have a laminate structure in which an aluminum film having a thickness of 100 nm is used as the first metal material layer 21a and a titanium film having a thickness of 10 nm is used as the second metal material layer 21b.

In this embodiment, the lower electrode 21 having the laminate structure described above is formed in each pixel by patterning.

In addition, the periphery of the lower electrode 21 is covered with the insulating pattern 7 to isolate the organic electroluminescent element EL. This insulating pattern 7 has an aperture window 7a which widely exposes the lower electrode 21, and this aperture window 7a is a pixel opening of the organic electroluminescent element EL. The insulating pattern 7 described above is formed, for example, using a photosensitive resin and is patterned by a lithographic method.

In addition, an organic layer 23 is provided to cover the lower electrode 21 which is exposed through the insulating pattern 7. This organic layer 23 has a laminate structure at least including an organic light emitting layer and is formed, whenever necessary, by laminating a hole injection layer, a hole transport layer, the organic light emitting layer, an electron transport layer, an electron injection layer, and at least one another layer in that order from the anode (in this embodiment, the lower electrode 21) side. In addition, in this embodiment, in accordance with wavelengths of light emitted from organic electroluminescent elements EL, the respective organic layers each at least including the organic light emitting layer are formed in pixels by patterning to have different structures. In addition, pixels at different wavelengths may include common layers. Furthermore, when this organic electroluminescent element EL is formed to have a minute resonator structure, in accordance with the wavelength extracted from each organic electroluminescent element EL, the thickness of the organic layer 23 is adjusted in this embodiment.

An upper electrode 25 is provided to cover the organic layer 23 and to sandwich the organic layer 23 with the lower electrode 21. This upper electrode 25 is an electrode through which light generated in the organic light emitting layer of the organic electroluminescent element EL is extracted and is formed of a material having light transmission characteristics. In addition, in this embodiment, since the lower electrode 21 functions as an anode, this upper electrode 25 is formed using a material so that at least one side in contact with the organic layer 23 functions as a cathode. In addition, the upper electrode 25 described above may be formed as a common electrode of each pixel. Furthermore, when this organic electroluminescent element EL is formed to have a minute resonator structure, this upper electrode 25 is formed to have a structure having semi-transmissive semi-reflective characteristics.

In addition, each pixel portion in which the organic layer 23 is provided between the lower electrode 21 and the upper electrode 25 is a portion functioning as the organic electroluminescent element EL.

In addition, although not being shown in the figure, a surface side at which each organic electroluminescent element EL is formed is covered with a sealing resin formed of a light-transmissive material, and a counter substrate formed of a light-transmissive material is adhered to the organic electroluminescent element EL side with the sealing resin provided therebetween, so that the display device 1 is formed.

Figure 3:
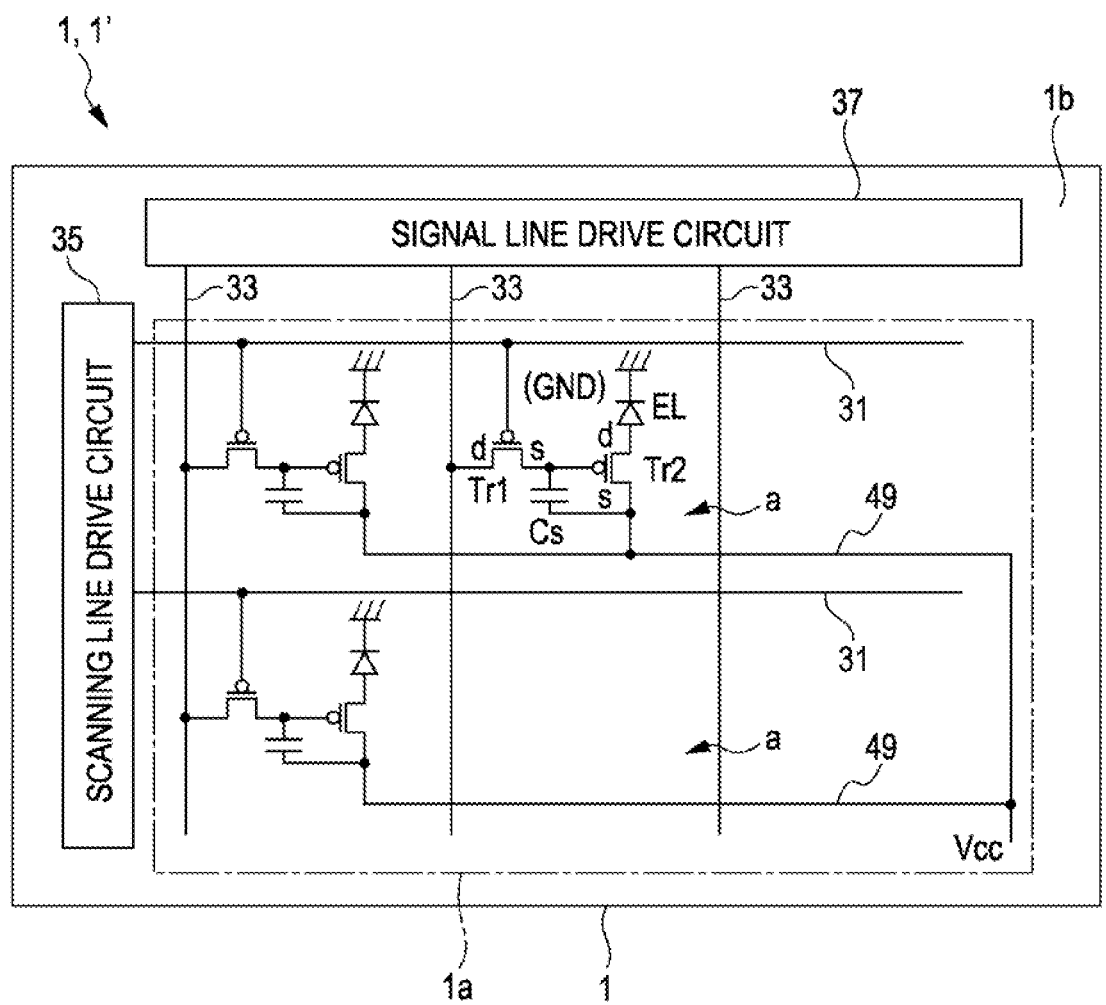
FIG. 3 is a circuit diagram showing one example of a circuit structure of the display device.

In this display device 1, the thin film transistor Tr having the structure described above and the organic electroluminescent element EL connected thereto are disposed in each pixel provided on the substrate 3, and the entire circuit structure is formed, for example, as shown in a circuit diagram of FIG. 3.

As shown in this figure, a display region 1a and a peripheral region 1b are defined on the substrate 3 of the display device 1. In the display region 1a, scanning lines 31 and signal lines 33 are disposed in a lateral and a longitudinal direction, respectively, to form a pixel array portion in which one pixel a is provided at each of intersections between the scanning lines 31 and the signal lines 33. In addition, in the peripheral region 1b, there are provided a scanning line drive circuit 35 which scan-drives the scanning lines 31 and a signal line drive circuit 37 which supplies image signals (that is, input signals) in accordance with luminance information to the signal lines 33.

A pixel circuit provided at each of the intersections between the scanning lines 31 and the signal lines 33 is formed, for example, of a switching thin film transistor Tr1, a driving thin film transistor Tr2, a retentive capacity Cs, and the organic electroluminescent element EL. In addition, by the drive of the scanning line drive circuit 35, an image signal written from the signal line 33 through the switching thin film transistor Tr1 is stored in the retentive capacity Cs, and a current corresponding to a stored signal amount is supplied to the organic electroluminescent element EL from the driving thin film transistor Tr2, so that the organic electroluminescent element EL emits light with the luminance corresponding to this current value. In addition, the driving thin film transistor Tr2 and the retentive capacity Cs are connected to a common power source supply line (Vcc) 49.

In the pixel circuit described above, the cross-sectional view of FIG. 1 is a cross-sectional portion in which the thin film transistor Tr2 and the organic electroluminescent element EL are laminated to each other. In addition, the thin film transistor Tr1 shown in the pixel circuit is formed using the same layers as those of the thin film transistor Tr2. In addition, the retentive capacity Cs shown in the pixel circuit is formed by laminating layer portions of the gate electrode, the gate insulating film, and the drain electrode of the thin film transistor Tr2. Furthermore, the scanning lines 31 shown in the pixel circuit are each formed using the same layer as that of the gate electrode 11 in the cross-sectional view, and the signal lines 33 and the power source supply lines 49 shown in the pixel circuit are formed using the same layers as those of the source electrode 15s and the drain electrode 15d in the cross-sectional view.

In addition, the above structure of the pixel circuit is described merely by way of example, and whenever necessary, in the pixel circuit, a capacity element may be provided, and a plurality of transistors may be further provided to form the pixel circuit. In addition, in the peripheral region 1b, in accordance with the change in pixel circuit, a necessary drive circuit may be additionally provided.

Method for Manufacturing Display Device of First Embodiment

Next, a method for manufacturing the display device described with reference to FIG. 1 will be described using cross-sectional views of FIGS. 4A to 5B.

Figure 4A:
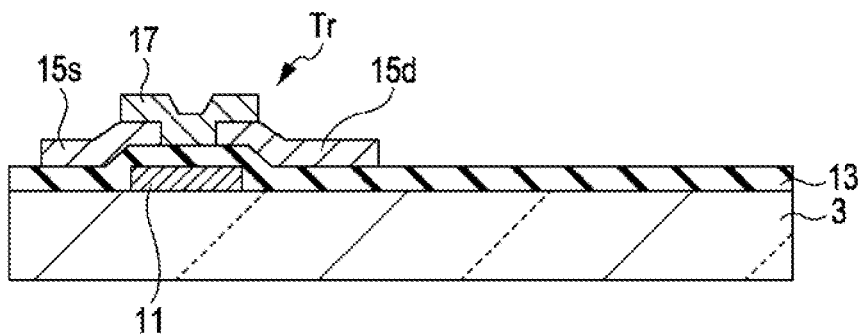
FIGS. 4A to 4D are cross-sectional manufacturing steps (part 1) illustrating a method for manufacturing the display device according to the first embodiment.

First, as shown in FIG. 4A, the gate electrode 11 of the thin film transistor Tr is formed on the substrate 3. In this process, an aluminum film is first formed by a resistance heating deposition method, and a photoresist is applied on a top portion of the aluminum film by spin coating and is then baked. Pattern exposure is performed on the baked photoresist film using a mask aligner, and a development treatment is then performed, so that a resist pattern (not shown in the figure) is formed. Subsequently, the aluminum film is wet-etched by a phosphoric acid solution as an etchant using the resist pattern as a mask, so that the gate electrode 11 is formed by patterning of the aluminum film. After the gate electrode 11 is formed, the resist pattern is removed by peeling.

Next, spin coating of a poly(vinyl phenol) solution is performed to form the gate insulating film 13, and a baking treatment is then performed for crosslinking.

Subsequently, the source electrode 15s and the drain electrode 15d are formed on the gate insulating film 13. In this process, after a photoresist is spin-coated and is then baked, pattern exposure is performed using a mask aligner, and a development treatment is then performed, so that a resist pattern (not shown in the figure) is formed. Next, a gold film is formed by a resistance heating deposition method, and the resist pattern is then removed by peeling. As a result, the source electrode 15s and the drain electrode 15d are formed by lift-off of a gold film provided on an upper portion of the resist pattern.

Next, by a resistance heating deposition method using a deposition mask, pentacene is pattern-deposited to form the semiconductor layer 17.

By the steps described above, the thin film transistor Tr is obtained.

Figure 4B:
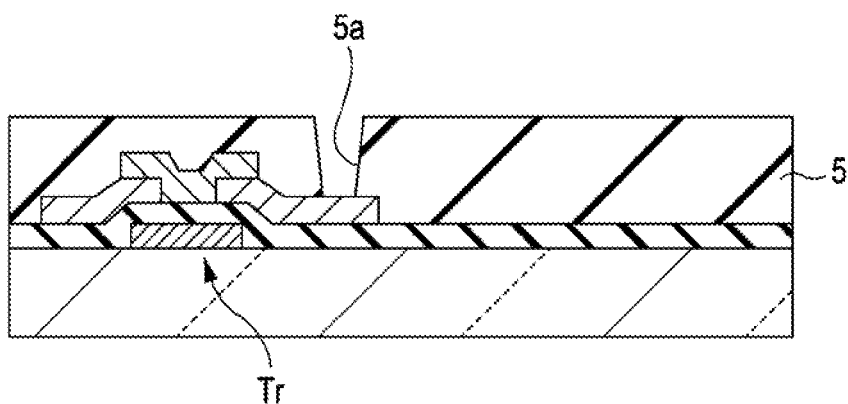

Next, as shown in FIG. 4B, the interlayer insulating film 5 covering the thin film transistor Tr is formed. In this process, first, as the interlayer insulating film 5, a poly(para-xylylene) film is formed by a CVD method. Subsequently, a photoresist is applied by spin coating on an upper portion of the interlayer insulating film 5, and baking is then performed. Pattern exposure is performed on the baked photoresist film using a mask aligner, and a development treatment is then performed, so that a resist pattern (not shown in the figure) is formed. Next, the interlayer insulating film 5 composed of poly(para-xylylene) is etched by oxygen plasma to form the connection hole 5a. After the connection hole 5a is formed, the resist pattern is removed by peeling.

Figure 4C:
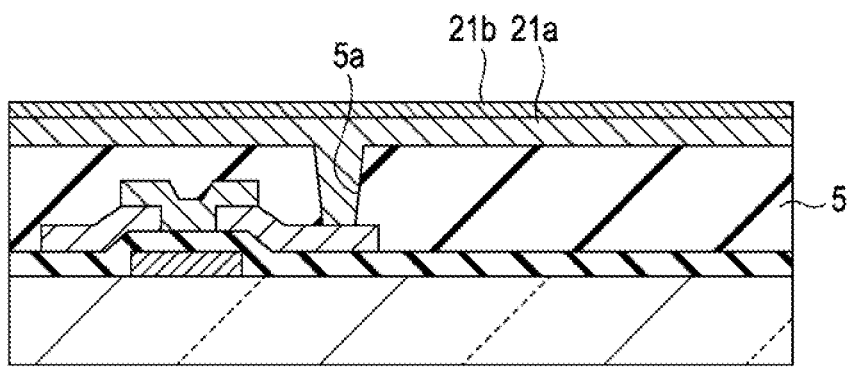

Next, as shown in FIG. 4C, a laminate film including titanium (Ti: 10 nm), aluminum (Al: 100 nm), and titanium (Ti: 10 nm) provided in that order from the lower side is formed on the interlayer insulating film 5 including the connection hole 5a by a resistance heating deposition method. The lower Ti layer is formed as an adhesion layer (not shown in the figure), the aluminum film is formed as the first metal material layer 21a, and the upper Ti layer is formed as the second metal material layer 21b.

Figure 4D:
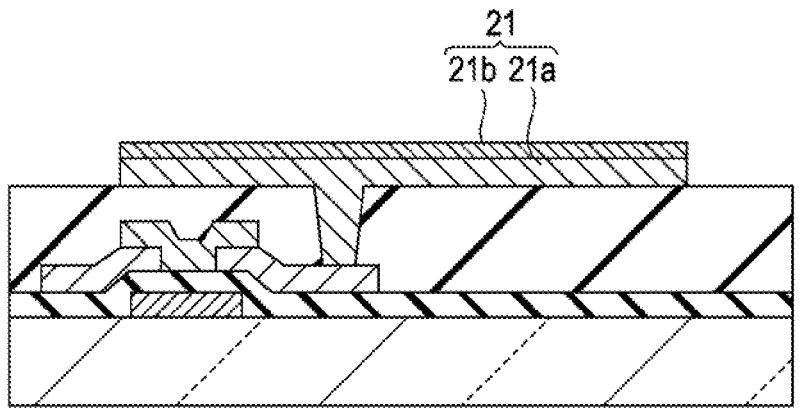

Subsequently, as shown in FIG. 4D, the laminate film including the first metal material layer 21a and the second metal material layer 21b together with the adhesion layer is patterned to form the lower electrode 21. In this process, a photoresist is spin-coated on the laminate film, and baking is then performed. Pattern exposure is performed on the baked photoresist film using a mask aligner, and a development treatment is then performed, so that a resist pattern (not shown in the figure) is formed. Next, the laminate film including the aluminum film and the titanium films is collectively wet-etched by a mixed acid containing ammonium fluoride, nitric acid, and sulfuric acid as an etchant using the resist pattern as a mask, so that the lower electrode 21 is formed by patterning. After the lower electrode 21 is formed, the resist pattern is removed by peeling.

Figure 5A:
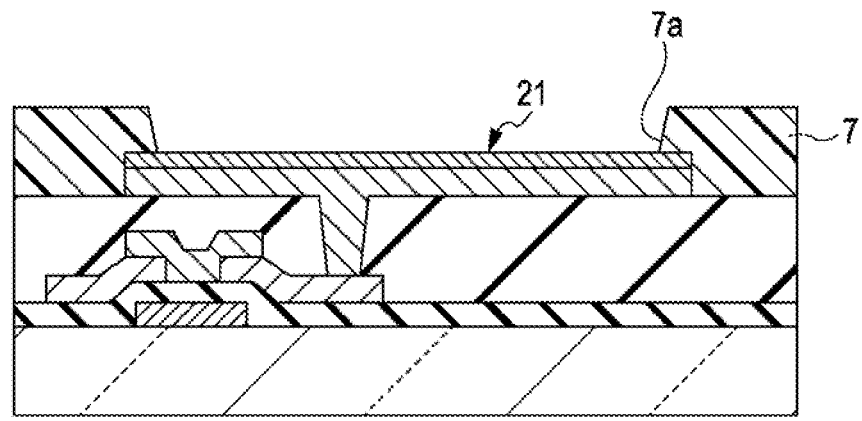
FIGS. 5A and 5B are cross-sectional manufacturing steps (part 2) illustrating the method for manufacturing the display device according to the first embodiment.
Figure 5B:
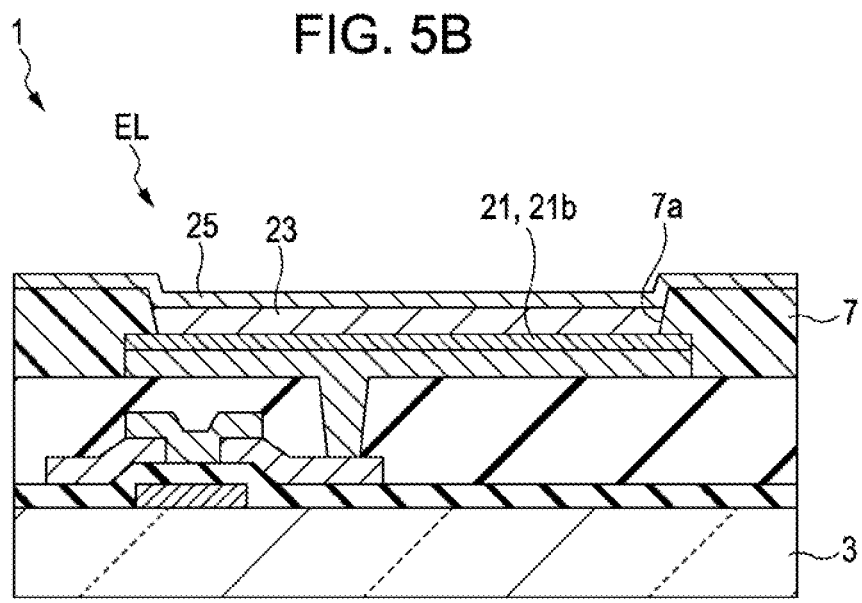

Subsequently, as shown in FIG. 5A, the insulating pattern 7 which has the aperture window 7a to expose the lower electrode 21 and which has a shape covering the periphery thereof is formed. In this process, a photosensitive composition material, such as a photoresist, is spin-coated so as to cover the lower electrode 21, and baking is then performed. Pattern exposure is performed on the baked photoresist film using a mask aligner, and a development treatment is then performed, so that a resist pattern having the aperture window 7a is formed as the insulating pattern 7. Finally, the insulating pattern 7 formed from the photoresist is surely cured by a post baking treatment.

After the steps described above are performed, as shown in FIG. 5B, the organic layer 23 covering the lower electrode 21 exposed through the aperture window 7a of the insulating pattern 7 is pattern-formed by a resistance heating deposition method using a deposition mask. Subsequently, by a resistance heating deposition method, the upper electrode 25 is formed over the entire surface above the substrate 3, so that the organic electroluminescent element EL is formed.

Subsequently, the sealing resin (not shown in the figure) is applied on the upper electrode 25, and the counter electrode is adhered thereto for sealing, so that the display device 1 is formed.

The above-described display device 1 according to the first embodiment includes a top emission electroluminescent element EL in which emission light is extracted from the upper electrode 25 side, and in particular, the lower electrode 21 is formed so that the second metal material layer 21b having a superior alkaline-solution resistance is provided on the first metal material layer 21a having light reflection characteristics. Accordingly, the resistance of the lower electrode 21 against an alkaline solution can be ensured by the presence of the second metal material layer 21b which forms the surface of the lower electrode 21.

Hence, as described above with reference to FIG. 5A, when the insulating pattern 7 is formed on the lower electrode 21 by a lithographic treatment, the second metal material layer 21b functions as a barrier for the first metal material layer 21a against an alkaline solution which is used as a developing agent. Hence, as a material forming the first metal material layer 21a, even if selection of the material is performed only based on the light reflection characteristics without any consideration of the alkaline-solution resistance, the light reflection characteristics of the first metal material layer 21a can be maintained. In addition, since the second metal material layer 21b is formed so that the transmission of light generated in the organic electroluminescent element EL is ensured, the light reflection characteristics of the first metal material layer 21a can be effectively used in the lower electrode 21, and the light extraction efficiency from the upper electrode 25 side can be ensured.

As a result, in the display device 1 including a top emission organic electroluminescent element EL, the lightning failure of the organic electroluminescent element EL caused by degradation of the lower electrode 21 in an alkaline development treatment can be prevented.

In addition, in the first embodiment, the lower electrode 21 is formed to have a laminate structure of a titanium film as the adhesion layer, an aluminum film as the first metal material layer 21a, and a titanium film as the second metal material layer 21b, so that the etching can be performed using the same etchant. Hence, although the lower electrode 21 is formed to have a laminate structure, any additional steps are not necessary, and the method for manufacturing the display device 1 can be prevented from being complicated.

Incidentally, in an active matrix display device, as the thin film transistor forming a pixel drive circuit, when an organic thin film transistor is used which is obtained by an inexpensive process in which film formation is performed by application, an equipment cost can be reduced. However, the organic thin film transistor is liable to be degraded due to plasma damage.

Accordingly, in the formation of the lower electrode, for example, as in the case disclosed in Japanese Unexamined Patent Application Publication No. 2002-216976, when a sputtering method which generates plasma is used in a step of forming a buffer thin layer of an oxide on a metal material layer, the characteristics of the thin film transistor forming the pixel drive circuit are liable to be degraded.

On the other hand, in this embodiment, the titanium film and the aluminum film forming the lower electrode 21 can be formed by a resistance heating deposition method in which no plasma is generated. Hence, when the above films are formed, no plasma damage is generated to the thin film transistor Tr provided under the interlayer insulating film 5, so that the characteristics of the thin film transistor Tr can be preferably maintained. In addition, although degradation in characteristics of a semiconductor layer formed of silicon may occur in some cases, in particular, when the semiconductor layer 17 forming a channel portion is a semiconductor layer formed of an organic material, depending on plasma generation conditions, the characteristics of the thin film transistor Tr covered with the interlayer insulating film 5 are liable to be degraded due to plasma damage. Furthermore, in a thin film transistor Tr having a bottom gate structure, the semiconductor layer 17 is disposed closer to the surface of the interlayer insulating film 5 than that in the case of a top gate structure, the characteristics of the thin film transistor Tr are more liable to be degraded due to the above plasma damage. However, as described above, since the titanium film and the aluminum film forming the lower electrode 21 can be formed by a resistance heating deposition method in which no plasma is generated, the characteristics of the bottom-gate thin film transistor Tr using the semiconductor layer 17 of an organic material as described above can be prevented from being degraded. By this resistance heating deposition method, films may also be formed using platinum instead of titanium and silver instead of aluminum. In addition, as one example of the manufacturing method in which no plasma is generated, besides the above resistance heating deposition method, for example, a printing method in which a metal film is formed by printing may be mentioned. In addition, when the metal films forming the lower electrode 21 are formed, among various methods, by using a manufacturing method in which no plasma is generated, no plasma damage is generated to the thin film transistor Tr, and as a result, the characteristics of the thin film transistor Tr can be preferably maintained.

Structure of Display Device of Second Embodiment

Figure 6:
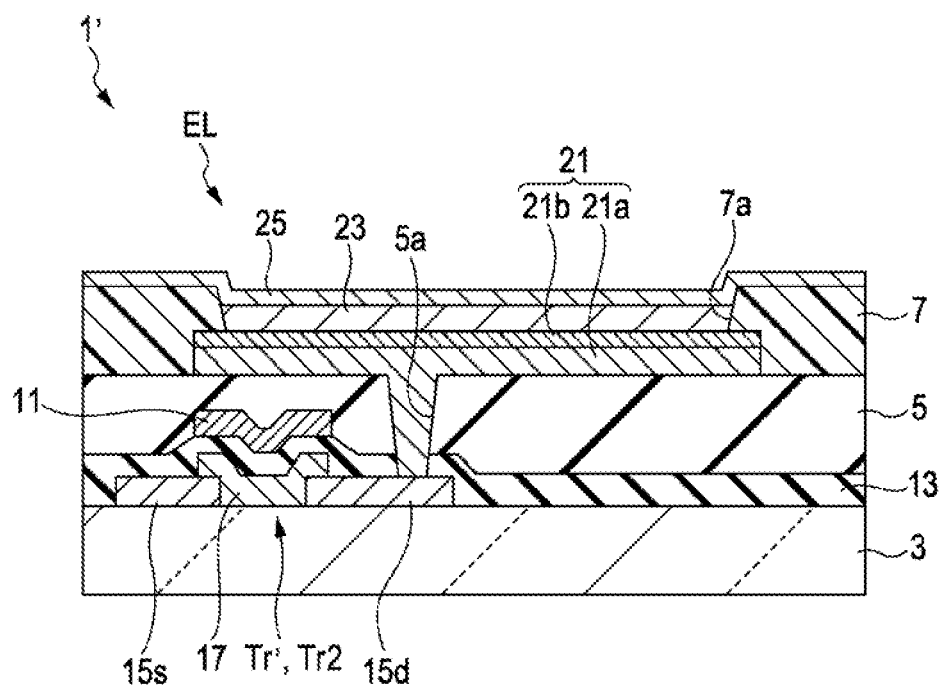
FIG. 6 is a cross-sectional view showing the structure of a display device according to a second embodiment.

FIG. 6 is a cross-sectional view of the structure of one pixel of a display device according to a second embodiment. A display device 1' shown in this figure is an active matrix display device including organic electroluminescent elements EL. The difference of this display device 1' shown in FIG. 6 from the display device of the first embodiment described with reference to FIG. 1 is the structure of a thin film transistor Tr' provided in each pixel, and the remaining structure is similar to that of the first embodiment.

That is, in the thin film transistor Tr' provided in each pixel of this display device 1', although an organic semiconductor material is used as in the first embodiment, a top gate/bottom contact organic thin film transistor is formed in this embodiment, and this structure is different from that of the first embodiment.

In the thin film transistor Tr' described above, a source electrode 15s and a drain electrode 15d are provided on a substrate 3 so that end portions of the electrodes face each other. In addition, a semiconductor layer 17 composed of an organic semiconductor material is formed by patterning as a channel forming portion from the end portion of the source electrode 15s to the end portion of the drain electrode 15d, and a gate insulating film 13 is formed so as to cover these elements described above. In addition, a gate electrode 11 is provided on the gate insulating film 13 so as to overlap the semiconductor layer 17 formed from the end portion of the source electrode 15s to the end portion of the drain electrode 15d, so that the thin film transistor Tr' is formed.

As in the first embodiment, an interlayer insulating film 5 covering this thin film transistor Tr' is formed as a planarized insulating film having a flat surface, and a connection hole 5a is provided in the interlayer insulating film 5 so as extend to the drain electrode 15d of the thin film transistor Tr'. However, the connection hole 5a is continuously formed also in the gate insulating film 13.

The structure of the organic electroluminescent element EL provided on the interlayer insulating film 5 is similar to that of the first embodiment. That is, a lower electrode 21 is characteristically formed to include a first metal material layer 21a having light reflection characteristics and a second metal material layer 21b provided thereon which has a superior alkaline-solution resistance to that of the first metal material layer 21a, and materials and film thicknesses of the metal material layers are also similar to those of the first embodiment.

In addition, in this display device 1', the thin film transistor Tr' having the above-described structure and the organic electroluminescent element EL connected thereto are disposed in each pixel on the substrate 3, and as in the first embodiment, the entire circuit structure is formed as shown, for example, in the circuit structure view of FIG. 3.

Method for Manufacturing Display Device of Second Embodiment

In a method for manufacturing the display device 1' having the structure described with reference to FIG. 6, as the differences from the method for manufacturing the display device according to the first embodiment, there are mentioned a procedure for forming the thin film transistor Tr' and a step of etching the gate insulating film 13 together with the interlayer insulating film 5 which is carried out when the connection hole extending to the thin film transistor Tr' is formed. Hereinafter, the method for manufacturing the display device 1' will be described with reference to cross-sectional manufacturing steps of FIGS. 7A to 8B.

Figure 7A:
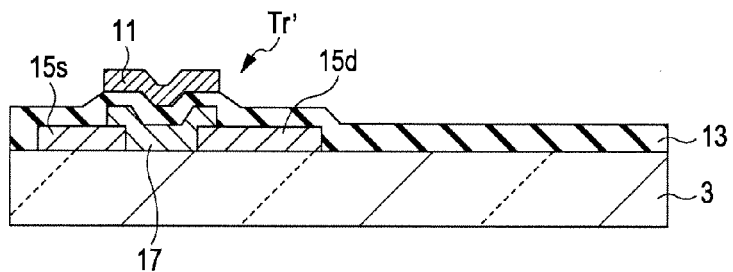
FIGS. 7A to 7E are cross-sectional manufacturing steps (part 1) illustrating a method for manufacturing the display device according to the second embodiment.

First, as shown in FIG. 7A, the source electrode 15s and the drain electrode 15d of the thin film transistor Tr are formed on the substrate 3. In this process, after a photoresist is spin-coated and is then baked, pattern exposure is performed using a mask aligner, and a development treatment is then performed, so that a resist pattern (not shown in the figure) is formed. Next, a gold film is formed by a resistance heating deposition method, and the resist pattern is removed by peeling. As a result, the source electrode 15s and the drain electrode 15d are formed by lift-off of a gold film provided on an upper portion of the resist pattern.

Next, by a resistance heating deposition method using a deposition mask, pentacene is pattern-deposited from the end portion of the source electrode 15s to the end portion of the drain electrode 15d to form the semiconductor layer 17.

Subsequently, as the gate insulating film 13, a poly(vinyl phenol) solution is spin-coated, and a baking treatment is then performed for crosslinking.

Next, the gate electrode 11 of the thin film transistor Tr' is formed on the gate insulating film 13 at a position located over the semiconductor layer 17. In this process, after an aluminum film is formed by a resistance heating deposition method, a photoresist is spin-coated on the aluminum film, and baking is then performed. Pattern exposure is performed on the baked photoresist film using a mask aligner, and a development treatment is then performed, so that a resist pattern (not shown in the figure) is formed. Subsequently, the aluminum film is wet-etched by a phosphoric acid solution as an etchant using the resist pattern as a mask, so that the gate electrode 11 is formed from the aluminum film by patterning. After the gate electrode 11 is formed, the resist pattern is removed by peeling.

Accordingly, the thin film transistor Tr' is obtained.

Figure 7B:
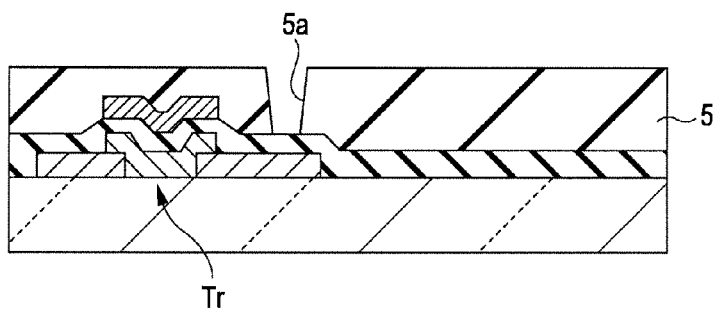

Next, as shown in FIG. 7B, the interlayer insulating film 5 covering the thin film transistor Tr' is formed. In this process, first, as the interlayer insulating film 5, a poly(para-xylylene) film is formed by a CVD method. Subsequently, a photoresist is spin-coated on an upper portion of the interlayer insulating film 5, and baking is then performed. Pattern exposure is performed on the baked photoresist film using a mask aligner, and a development treatment is then performed, so that a resist pattern (not shown in the figure) is formed. Next, the interlayer insulating film 5 composed of poly(para-xylylene) is etched by oxygen plasma to form the connection hole 5a.

Figure 7C:
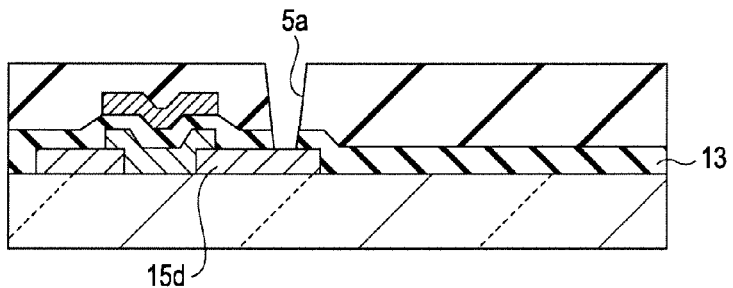

Subsequently, as shown in FIG. 7C, in a step performed continuously following the etching of the interlayer insulating film 5 of poly(para-xylylene), the gate insulating film 13 located at the bottom portion of the connection hole 5a is removed by etching using oxygen plasma, so that the connection hole 5a is excavated to the drain electrode 15d. After the connection hole 5a is formed, the resist pattern is removed by peeling.

Hereinafter, a manufacturing procedure similar to that of the first embodiment may be performed.

Figure 7D:
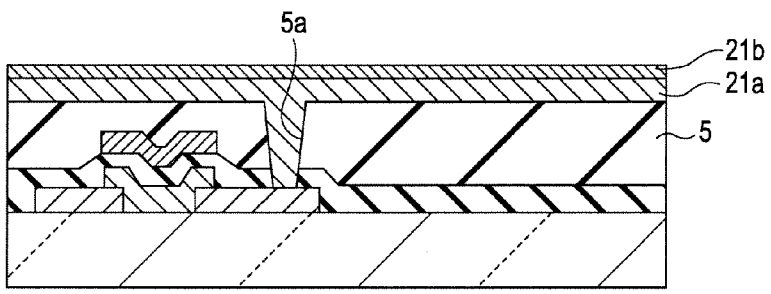

That is, as shown in FIG. 7D, a laminate film including titanium (Ti: 10 nm), aluminum (Al: 100 nm), and titanium (Ti: 10 nm) provided in that order from the lower side is formed on the interlayer insulating film 5 including the connection hole 5a by a resistance heating deposition method. The lower Ti layer is formed as an adhesion layer (not shown in the figure), the aluminum film is formed as the first metal material layer 21a, and the upper Ti layer is formed as the second metal material layer 21b.

Figure 7E:
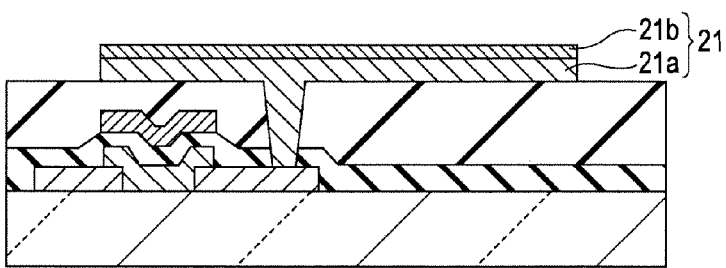

Subsequently, as shown in FIG. 7E, the laminate film including the first metal material layer 21a and the second metal material layer 21b together with the adhesion layer is patterned to form the lower electrode 21. In this process, a photoresist is spin-coated on the laminate film, and baking is then performed. Pattern exposure is performed on the baked photoresist film using a mask aligner, and a development treatment is then performed, so that a resist pattern (not shown in the figure) is formed. Next, the laminate film including the aluminum film and the titanium films is collectively wet-etched by a mixed acid containing ammonium fluoride, nitric acid, and sulfuric acid as an etchant using the resist pattern as a mask, so that the lower electrode 21 is formed by patterning. After the lower electrode 21 is formed, the resist pattern is removed by peeling.

Figure 8A:
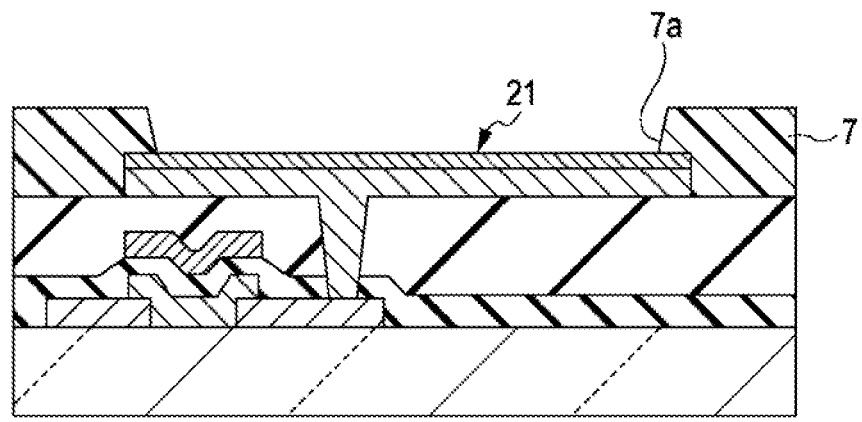
FIGS. 8A and 8B are cross-sectional manufacturing steps (part 2) illustrating the method for manufacturing the display device according to the second embodiment.
Figure 8B:
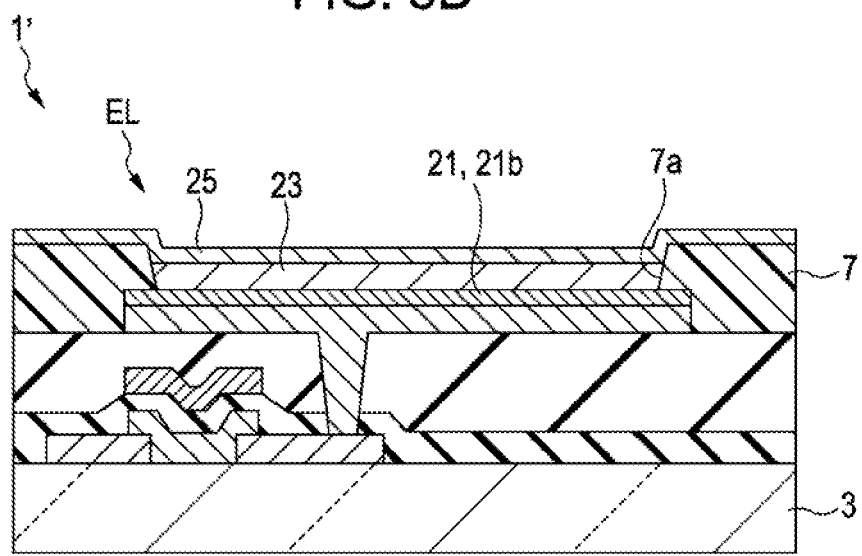

Subsequently, as shown in FIG. 8A, an insulating pattern 7 which has an aperture window 7a to expose the lower electrode 21 and which has a shape covering the periphery thereof is formed. In this process, first, a photosensitive composition material, such as a photoresist, is spin-coated so as to cover the lower electrode 21, and baking is then performed. Pattern exposure is performed on the baked photoresist film using a mask aligner, and a development treatment is then performed, so that a resist pattern having the aperture window 7a is formed as the insulating pattern 7. Finally, the insulating pattern 7 formed from the photoresist is surely cured by a post baking treatment.

After the steps described above are performed, as shown in FIG. 8B, an organic layer 23 covering the lower electrode 21 exposed through the aperture window 7a of the insulating pattern 7 is pattern-formed by a resistance heating deposition method using a deposition mask. Subsequently, by a resistance heating deposition method, an upper electrode 25 is formed over the entire surface above the substrate 3, so that the organic electroluminescent element EL is formed.

Subsequently, the sealing resin (not shown in the figure) is applied on the upper electrode 25, and the counter electrode is adhered thereto for sealing, so that the display device 1' is obtained.

As in the first embodiment, the display device 1' according to the second embodiment described above also includes a top emission electroluminescent element EL in which emission light is extracted from the upper electrode 25 side, and in particular, the lower electrode 21 is formed so that the second metal material layer 21b having a superior alkaline-solution resistance is provided on the first metal material layer 21a having light reflection characteristics. Accordingly, as in the first embodiment, the lighting failure of the organic electroluminescent element EL caused by degradation of the lower electrode 21 in an alkaline development treatment can be prevented.

In addition, also in this second embodiment, since the lower electrode 21 is formed to have a laminate structure including a titanium film as the adhesion layer, an aluminum film as the first metal material layer 21a, and a titanium film as the second metal material layer 21b, the etching can be performed using the same etchant. Hence, although the lower electrode 21 is formed to have a laminate structure, any additional steps are not necessary, and the method for manufacturing the display device 1' can be prevented from being complicated.

Furthermore, the titanium films and the aluminum film forming the lower electrode 21 can be formed by a resistance heating deposition method in which no plasma is generated. Hence, when the above films are formed, no plasma damage is generated to the thin film transistor Tr provided under the interlayer insulating film 5, so that the characteristics of the thin film transistor Tr' can be preferably maintained. In particular, according to the second embodiment, the thin film transistor Tr' is formed as a top gate type transistor. Accordingly, since the semiconductor layer 17 is disposed at a lower side than the gate electrode 11, damage from above the interlayer insulating film 5 is not likely to be applied to the semiconductor layer 17 as compared to the case of the first embodiment, and the characteristics of the thin film transistor Tr' can be easily maintained.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising:
    thin film transistors;
    lower electrodes each include an electrically conductive light-reflective first metal material layer and an electrically conductive second metal material layer, provided thereon which has a superior alkaline-solution resistance to that of the first metal material layer;
    an insulating pattern which is formed from a photosensitive composition material, which has opening portions to expose the lower electrodes, and which covers peripheries of the lower electrodes;
    organic layers each of which at least include an organic light emitting layer and which are provided in the opening portions so as to cover the lower electrodes; and
    a light-transmissive upper electrode provided to sandwich the organic layers with the lower electrodes,
    wherein a light-reflecting portion of the electrically conductive light-reflecting first metal material layer directly contacts an electrode of the thin film transistor.

2. The display device according to claim 1,
    wherein the second metal material layer is a thin film which transmits light generated in the organic light emitting layer to the first metal material layer which forms a reflection surface.

3. The display device according to claim 2,
    wherein the second metal material layer has light transmission characteristics so that the reflection of visible light generated in the organic light emitting layer at the first metal material layer is maintained at at least 50% through the second metal material layer.

4. The display device according to claim 2,
    wherein the first metal material layer includes aluminum, and the second metal material layer includes titanium.

5. The display device according to claim 1, further comprising:
    an interlayer insulating film covering the thin film transistors,
    wherein the lower electrodes are provided on the interlayer insulating film so that the electrically conductive light-reflecting first metal material layer is connected to the thin film transistors through connection holes provided in the interlayer insulating film, and
    the first metal material layer and the second metal material layer are each formed from a material which is able to be formed into a film by a manufacturing method in which no plasma is generated.

6. The display device according to claim 5,
    wherein the first metal material layer includes aluminum, and
    the second metal material layer includes titanium.

7. The display device according to claim 1,
    wherein the thin film transistors include organic semiconductor layers,
    wherein the first metal material layer and the second metal material layer are each formed from a material which is able to be formed into a film by a manufacturing method in which no plasma is generated.

8. The display device according to claim 7,
    wherein as the manufacturing method in which no plasma is generated, a resistance heating deposition method is used.

9. The display device according to claim 1,
    wherein the thin film transistors include organic semiconductor layers,
    wherein the first metal material layer includes aluminum, and
    the second metal material layer includes titanium.

10. The display device according to claim 1,
    wherein the first metal material layer includes aluminum, silver, or an alloy thereof.

11. A method for manufacturing a display device, the method comprising:
    forming thin firm transistors;
    forming lower electrodes each including an electrically conductive light-reflective first metal material layer and an electrically conductive second metal material layer provided thereon which has a superior alkaline-solution resistance to that of the first metal material layer;
    forming an insulating pattern by a lithographic method which has opening portions to expose the lower electrodes and which covers peripheries of the lower electrodes;
    forming organic layers each at least including an organic light emitting layer in the opening portions so as to cover the lower electrodes; and
    forming a light-transmissive upper electrode to sandwich the organic layers with the lower electrodes,
    wherein a light-reflecting portion of the electrically conductive light-reflecting first metal material layer directly contacts an electrode of the thin film transistor.

12. The method for manufacturing a display device according to claim 11,
    wherein the insulating pattern is formed from a photosensitive composition material by performing exposure thereof, followed by performing development using an alkaline solution.

13. The method for manufacturing a display device according to claim 11, further comprising: before the lower electrodes are formed,
    forming an interlayer insulating film covering the thin film transistors,
    wherein the first metal material layer and the second metal material layer are formed on the interlayer insulating film by a manufacturing method in which no plasma is generated.

14. The method for manufacturing a display device according to claim 11, further comprising the steps of: before the lower electrodes are formed,
    forming an interlayer insulating film covering the thin film transistors,
    wherein the thin film transistors each include an organic semiconductor layer, and
    wherein the first metal material layer includes aluminum, and the second metal material layer includes titanium.

15. The method for manufacturing a display device according to claim 11,
    wherein when the lower electrodes are formed, laminate films each having the first metal material layer which includes aluminum and the second metal material layer which includes titanium are patterned by wet etching using the same etchant.

* * * * *